(12) United States Patent
Chen et al.

(10) Patent No.: US 8,199,486 B2
(45) Date of Patent: Jun. 12, 2012

(54) SERVER CABINET

(75) Inventors: Chin-Hui Chen, Taipei Hsien (TW); Zh-Wei Jian, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 280 days.

(21) Appl. No.: 12/581,904

(22) Filed: Oct. 20, 2009

(65) Prior Publication Data

US 2011/0063793 A1    Mar. 17, 2011

(30) Foreign Application Priority Data

Sep. 11, 2009   (CN) .......................... 2009 1 0306913

(51) Int. Cl.
*H05K 7/20* (2006.01)

(52) U.S. Cl. ............... 361/679.51; 361/679.46; 361/695; 312/223.1; 312/223.2

(58) Field of Classification Search ............... 361/679.51
See application file for complete search history.

(56) References Cited

U.S. PATENT DOCUMENTS

| | | | |
|---|---|---|---|
| 7,529,097 B2* | 5/2009 | Coglitore et al. | 361/725 |
| 7,843,683 B2* | 11/2010 | Suffern et al. | 361/679.46 |
| 7,978,469 B2* | 7/2011 | Tsakanikas | 361/690 |
| 7,986,526 B1* | 7/2011 | Howard et al. | 361/694 |
| 7,995,345 B2* | 8/2011 | Nguyen | 361/721 |
| 2005/0168945 A1* | 8/2005 | Coglitore | 361/695 |
| 2008/0049393 A1* | 2/2008 | Coglitore et al. | 361/687 |
| 2009/0059523 A1* | 3/2009 | Mallia et al. | 361/695 |
| 2010/0073868 A1* | 3/2010 | Mayer et al. | 361/679.51 |

* cited by examiner

*Primary Examiner* — Anthony Q Edwards
(74) *Attorney, Agent, or Firm* — Altis Law Group, Inc.

(57) ABSTRACT

A server cabinet includes a rack and an air baffle plate. The rack defines an interior space configured for accommodating a plurality of servers therein. The rack includes a top wall, an opposite bottom wall and two sidewalls respectively connected between left sides of the top and the bottom walls and right sides of the top and the bottom walls. The servers are arranged along a bottom-to-top direction. Each of the servers is fixed between the two sidewalls. A space is defined between a topmost server and the top wall. The air baffle plate is positioned in the space for blocking an airflow on a rear side of the servers from flowing back to a front side of the servers via the space.

16 Claims, 5 Drawing Sheets

SERVER CABINET

BACKGROUND

1. Technical Field

The present disclosure relates to server cabinets, and more particularly to a server cabinet having improved heat dissipation efficiency for servers accommodated therein.

2. Description of Related Art

Computer server systems are known in the art. Typically, a computer server system has multiple standard servers mounted in a standard server cabinet. For standard servers, rack unit (U) is the unit of measurement of heights of the servers. One rack unit is 1.75 inches. The servers can be one (1U), two (2U) or n rack units (nU).

A common standard server cabinet includes a top wall, an opposite bottom wall, and four sidewalls, i.e., a left sidewall, a right sidewall, a front sidewall, and a rear sidewall, interconnected between the top and the bottom walls. Each of the front and rear sidewalls defines a plurality of air ventilation holes therein. The servers are fixed between the left and right sidewalls and arranged along a bottom-to-top direction of the server cabinet. A height of the server cabinet is typically greater than a sum of heights of the servers mounted therein. Thus, a space is defined between a topmost server and the top wall of the server cabinet with a height being greater than 1U. Each of the servers includes at least a power supply device, a motherboard, a hard disk drive, and an optical disk drive. As the server contains these hardware, a lot of heat is generated during operation. Thus, each of the servers further includes a plurality of drawing fans.

During operation, the drawing fans of each of the servers draw cooling air from a front side of the server cabinet into the server cabinet via the air ventilation holes of the front sidewall. The cooling air flows through the servers along a front-to-rear direction of the server cabinet to exchange heat with the servers. Finally, the heated air flows out of the server cabinet via the air ventilation holes of the rear sidewall. However, due to the space defined between the topmost server and the top wall, a portion of the heated air may flow back to the front side of the server cabinet via the space before flowing out of the server cabinet, which results in less cooling air flowing into the server cabinet to cool the servers effectively. Therefore, heat dissipation efficiency of the server cabinet is adversely affected.

DETAILED DESCRIPTION

Figure 1:
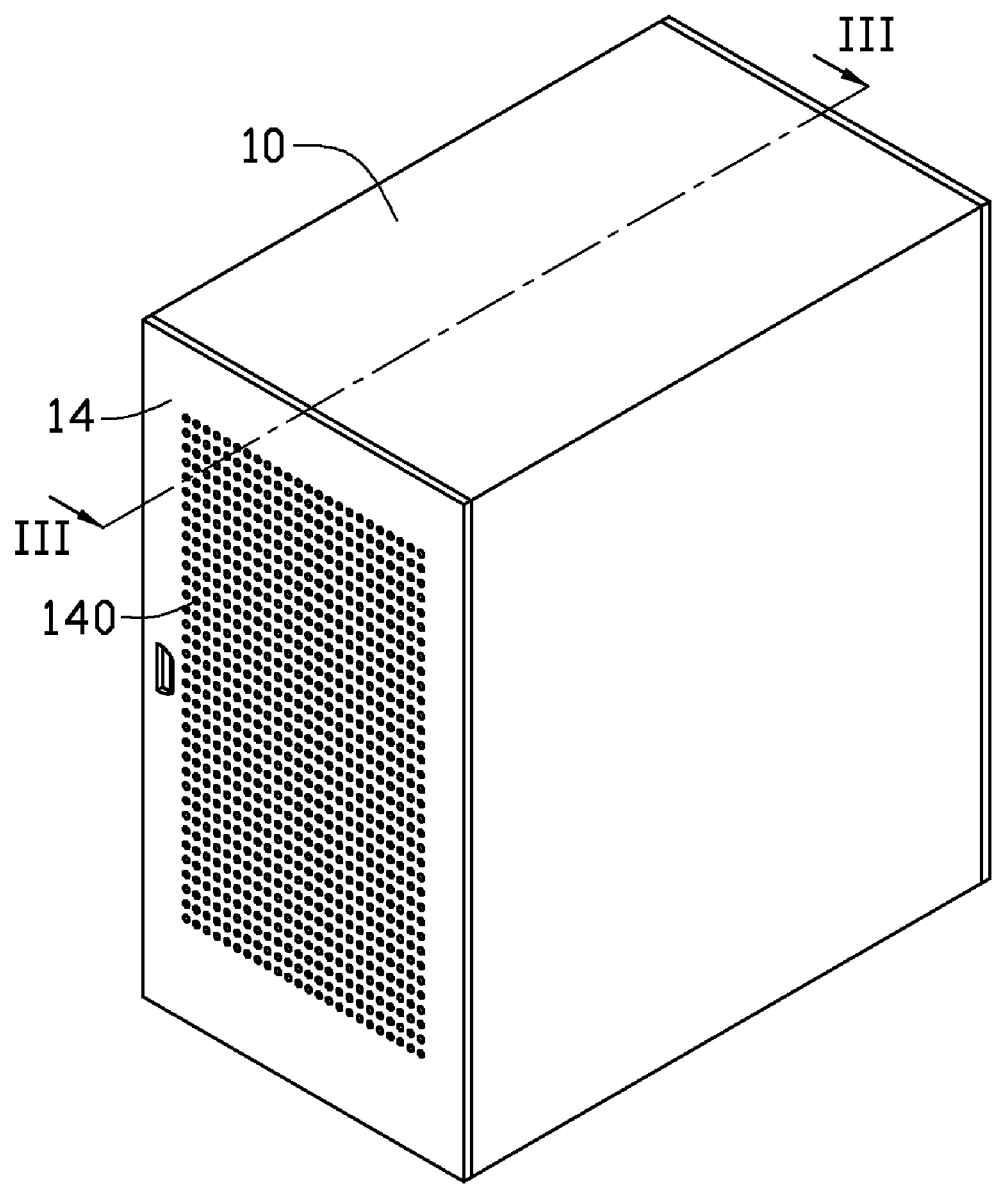
FIG. 1 is an isometric, assembled view of a server cabinet with a plurality of servers accommodated therein in accordance with a first embodiment of the present disclosure.
Figure 2:
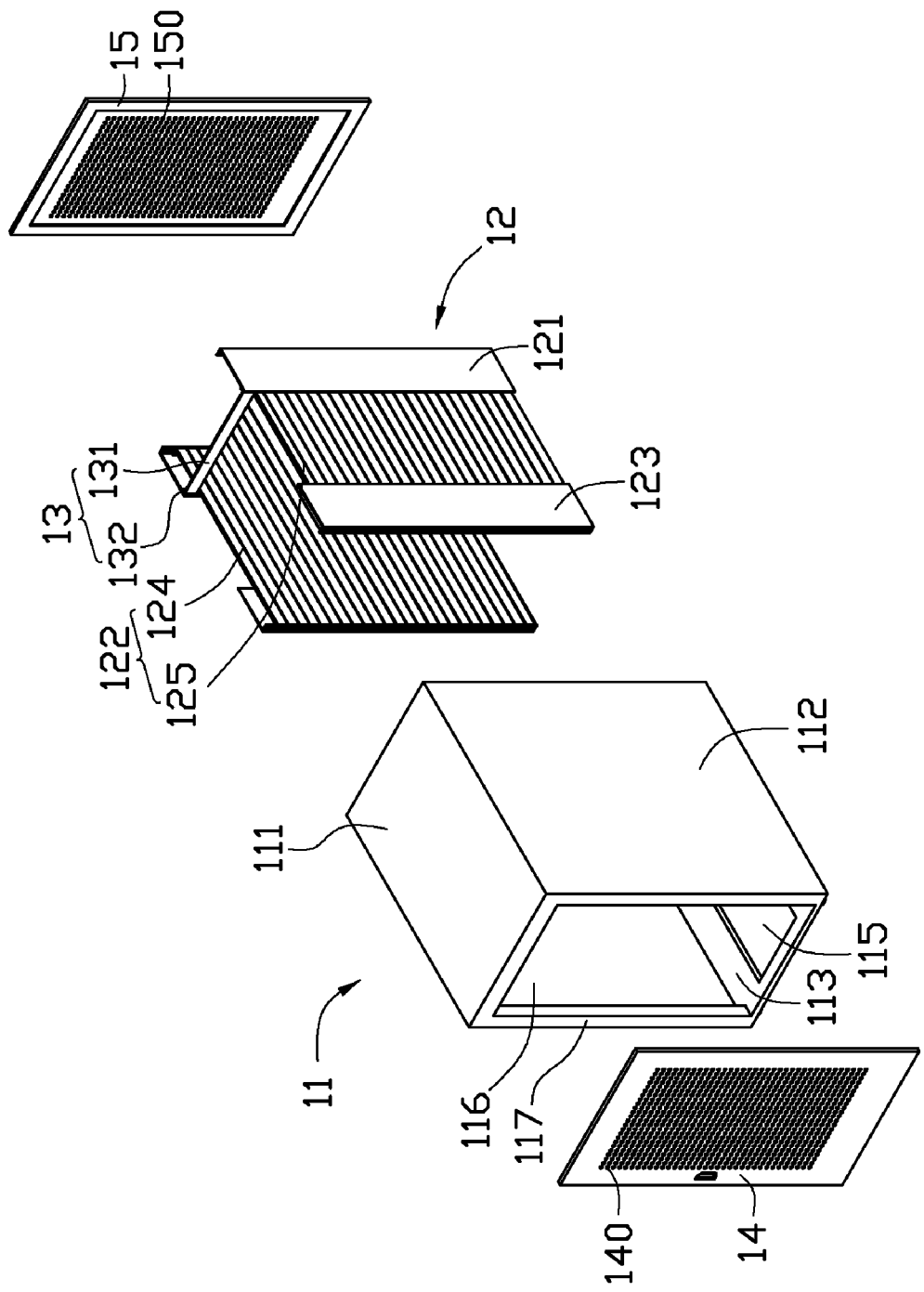
FIG. 2 is an isometric, exploded view of the server cabinet of FIG. 1.

Reference will now be made to the drawing figures to describe the present server cabinet in detail.

Referring to FIGS. 1-4, a server cabinet 10 configured for accommodating a plurality of servers 20 therein according a first embodiment of the present disclosure is shown. The server cabinet 10 is a 24U server cabinet (meaning actual height is at least a little greater than 24U), in which at most twenty-four 1U servers 20 can be mounted. Each of the servers 20 has a standard rectangular outline. A plurality of through holes 21 are defined in front and rear sides of each of the servers 20, respectively. Each of the servers 20 includes a plurality of drawing fan 23 therein. For increasing compatibility of the server cabinet 10, a length of the server cabinet 10 along a front-to-rear direction is longer than a length of each of the servers 20, and a height of the server cabinet 10 along a bottom-to-top direction is larger than the total height of the twenty-four 1U servers 20.

Referring back to FIG. 2, the server cabinet 10 includes a rack 11, a supporting frame 12 received in the rack 11, an elongated air baffle plate 13 fixed on a top end of the supporting frame 12. The rack 11 includes a rectangular top wall 111, a bottom wall 113 parallel to the top wall 111, a left sidewall 117 and a right sidewall 112 respectively connected between left and right sides of the top and bottom walls 111, 113, and a front door 14 and a back plate 15 respectively connected between front and rear sides of the top and bottom walls 111, 113. The bottom wall 113 defines an opening 115 at a central portion therein for extension of electrical wires (not shown) therethrough to be in electrical connection with the servers 20 and an exterior power source (not shown). The top wall 111, the bottom wall 113, the left and the right sidewalls 117, 112 cooperatively define a rectangular receiving space 116 for receiving the servers 20, hubs, disk array, and other network equipment therein. Each of the front door 14 and the back plate 15 defines a plurality of air ventilation holes 140 or 150 therein. The front door 14 and the back plate 15 are pivotably attached to front and the rear sides of the rack 11, respectively, so that the front door 14 and the back plate 15 can be opened and closed relative to the rack 11 according to needs.

The supporting frame 12 includes two front vertical walls 123, two rear vertical walls 121 and a plurality of pairs of rails 122. When the supporting frame 12 is received in the rack 11, the front vertical walls 123 are located at and confronted with front ends of the left and the right sidewalls 117, 112, respectively. Whilst, the rear vertical walls 121 are located at and confronted with rear ends of the left and the right sidewalls 117, 112, respectively. That is, one of the front vertical walls 123 and one of the rear vertical walls 121 are located at a left side of the rack 11 and respectively abutted against the front and the rear ends of the left sidewall 117, and the other front vertical wall 123 and the other rear vertical wall 121 are located at a right side of the rack 11 and respectively abutted against the front and the rear ends of the right sidewall 112. Heights of the front and the rear vertical walls 123, 121 are substantially equal to heights of the left and the right sidewalls 117, 112. The front and the rear vertical walls 123, 121 are fixed to the left and the right sidewalls 117, 112 of the rack 11 with top and bottom ends abutting against the top and bottom walls 111, 113, respectively.

Each pair of the rails 122 includes a first rail 124 connected between the front and the rear vertical walls 123, 121, which are located at the left side of the rack 11, and a second rail 125 connected between the front and the rear vertical walls 123, 121, which are located at the right side of the rack 11. The first rail 123 and the second rail 124 of each pair of rails 122 are level to each other. The pairs of the rails 122 are arranged equally spaced from each other along a bottom-to-top direction. Each pair of the rails 122 is used for supporting a server 20 thereon. A distance between a topmost pair of rails 122 and the top wall 111 is greater than the height of the server 20.

Figure 3:
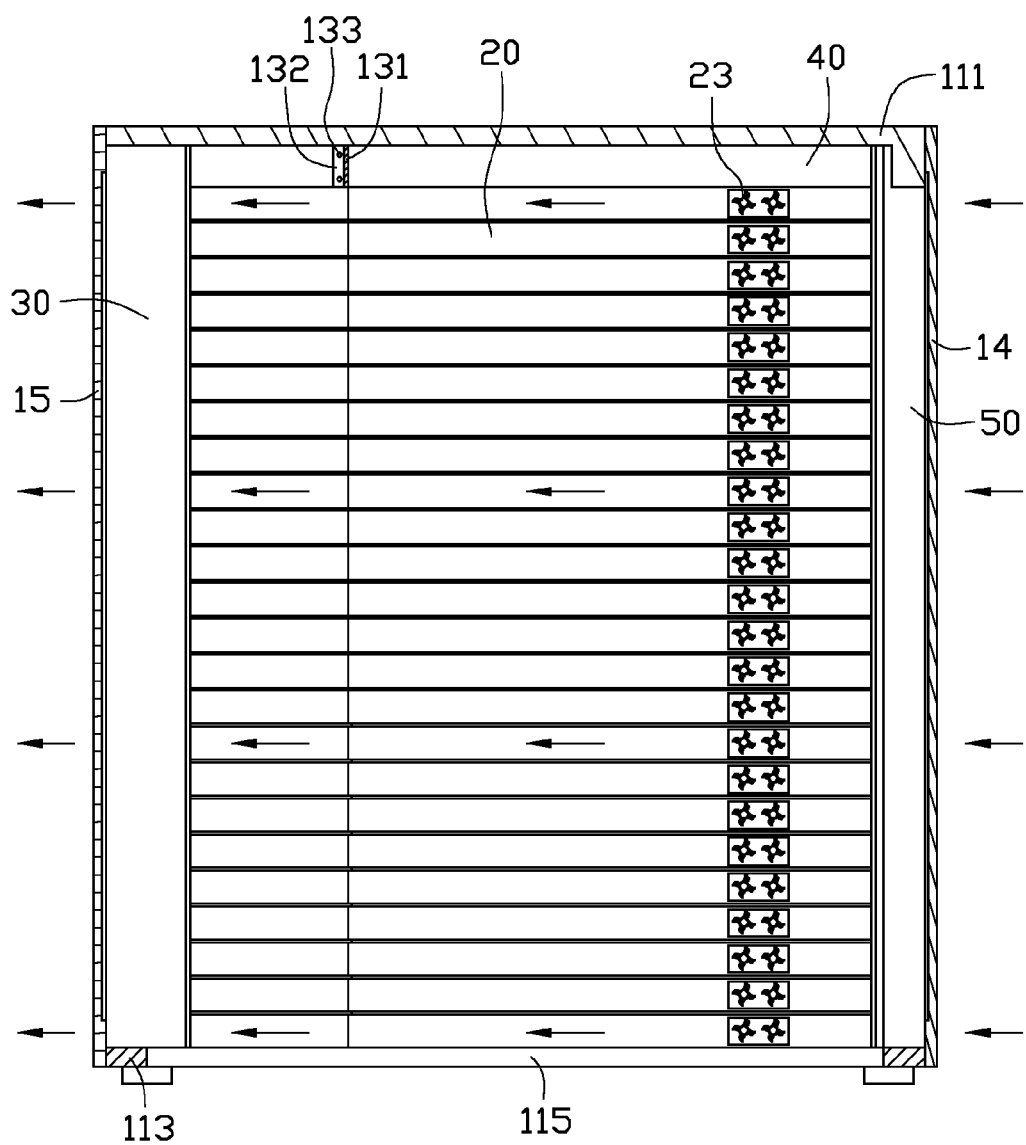
FIG. 3 is a cross-section view of FIG. 1, taken along line III-III thereof.

Referring to also to FIG. 3, the air baffle plate 13 includes an elongated main body 131 and two fixing portions 132 extending perpendicularly and rearward from left and right ends of the main body 131, respectively. Each of the fixing portions 132 is rectangular and defines two fixing holes 133 therein. A width of the main body 131 of the air baffle plate 13 is substantially equal to a minimum distance between the rear vertical walls 121. The air baffle plate 13 is located above the topmost pair of rails 122. The air baffle plate 13 is connected to the top end of the supporting frame 12 via the fixing portions 132 fixedly connected to the top ends of the rear vertical walls 121 by fasteners (not shown), respectively. The main body 131 is perpendicular to the first and second rails 123, 124 and abuts the left sidewall 117 and the right sidewall 112 after the supporting frame 12 being received in the rack 11. A top end of the main body 131 of the air baffle plate 13 is coplanar to the top ends of the rear vertical walls 132, and a bottom end of the main body 131 of the air baffle plate 13 is spaced from the topmost pair of rails 122 a distance of about 1U.

Figure 4:
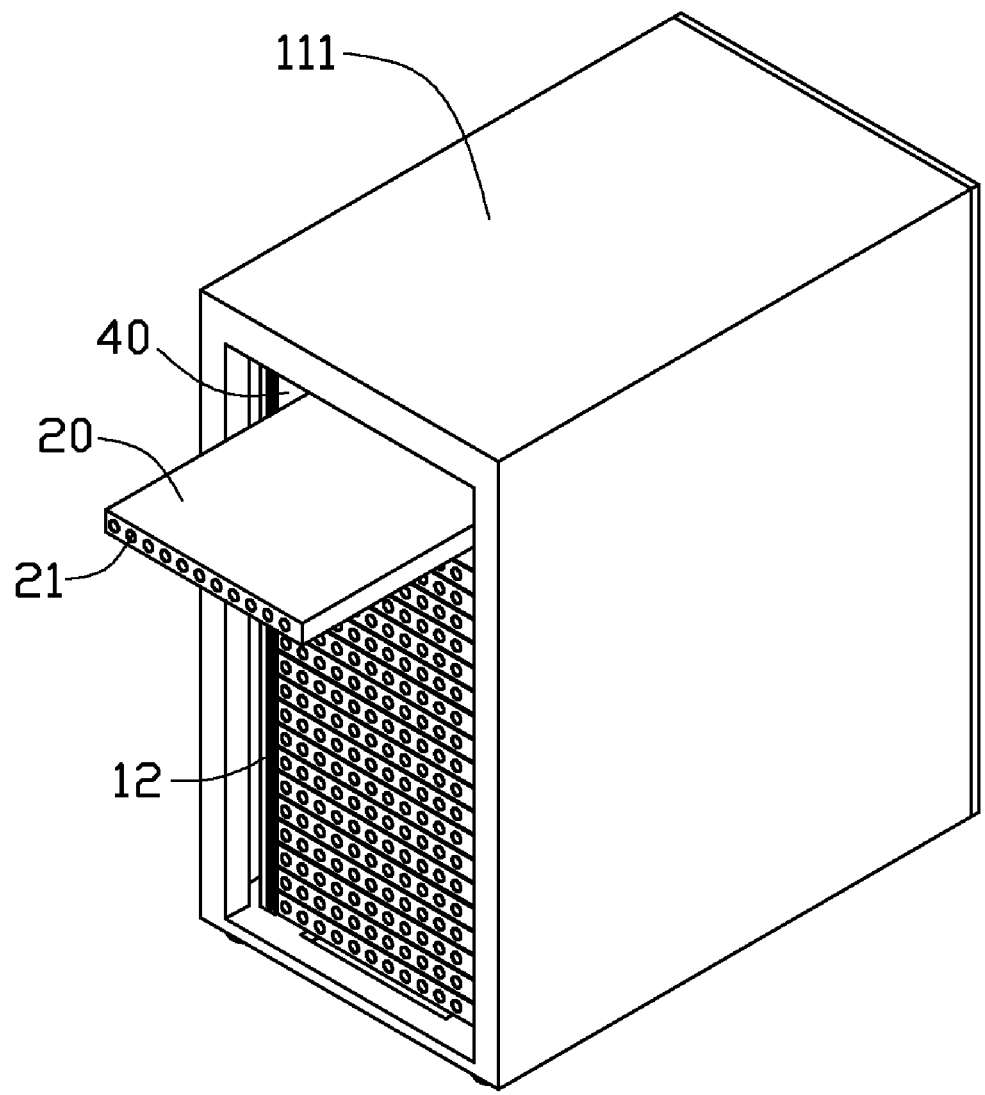
FIG. 4 is a schematic view showing a server being inserted into the server cabinet, wherein a front door of the server cabinet is omitted.

When assembled, the supporting frame 12 is received in the receiving space 116 of the server cabinet 10, the air baffle plate 13 is mounted at the top end of the supporting frame 12, and the servers 20 are stacked along the bottom-to-top direction of the supporting frame 12. Referring to FIG. 4, when one server 20 is installed into the sever cabinet 10, firstly the server 20 is positioned at the front end of the sever cabinet 10 with the server 20 aligned with a corresponding pair of rails 122 of the supporting frame 12, then the server 20 is pushed to move horizontally from the front end of the sever cabinet 10 towards the rear end of the sever cabinet 10 with the server 20 sliding along the corresponding pair of rails 122 until the server 20 entirely received in the server cabinet 10. Referring to FIG. 3, since the height of the server cabinet 10 is more than the sum of the heights of the twenty-four 1U servers 20, a space 40 is defined between a topmost server 20 and the top wall 111. In this embodiment, the space 40 has a height of about 50 millimeters. The air baffle plate 13 is positioned in the space 40 with the top and the bottom ends contacted with the top wall 111 and the topmost server 20, respectively. Thus, the space 40 is separated into a first portion communicated with a first room 50 which is formed between the servers 20 and the front door 14 and a second portion communicated with a second room 30 which is formed between the servers 20 and the back plate 15 by the air baffle plate 13.

During operation, the drawing fans 23 of each of the servers 20 rotate to draw cooling air into the server cabinet 10 to flow through the servers 20 along a front-to-rear direction to take heat away from the servers 20. As indicated by arrows in FIG. 3, the cooling air from outside adjacent to a front side of the server cabinet 10 firstly flows into the first room 50 of the server cabinet 10 via the air ventilation holes 140 of the front door 14. The cooling air then flows into each of the servers 20 to exchange heat with the servers 20 and thus becomes heated air flowing out of the servers 20. The heated air is accumulated in the second room 30 of the server cabinet 10 after flowing out of the servers 20. Finally, the heated air in the second room 30 flows out of the server cabinet 10 at a rear side of the server cabinet 10 via the air ventilation holes 150 of the back plate 15 to dissipate the heat of the servers 20. Though a portion of the heated air in the second room 30 may have a tendency to flow back towards the first room 50 via the space 40, it is prevented from doing so by the presence of the air baffle plate 13 positioned in the space 40. As a result, cooling air in the first room 50 can flow more smoothly along the front-to-rear direction to take heat away from the servers 20, and more cooling air from adjacent to the front side of the server cabinet 10 can enter into the first room 50 to flow through the servers 20 to take more heat away from the servers 20.

Figure 5:
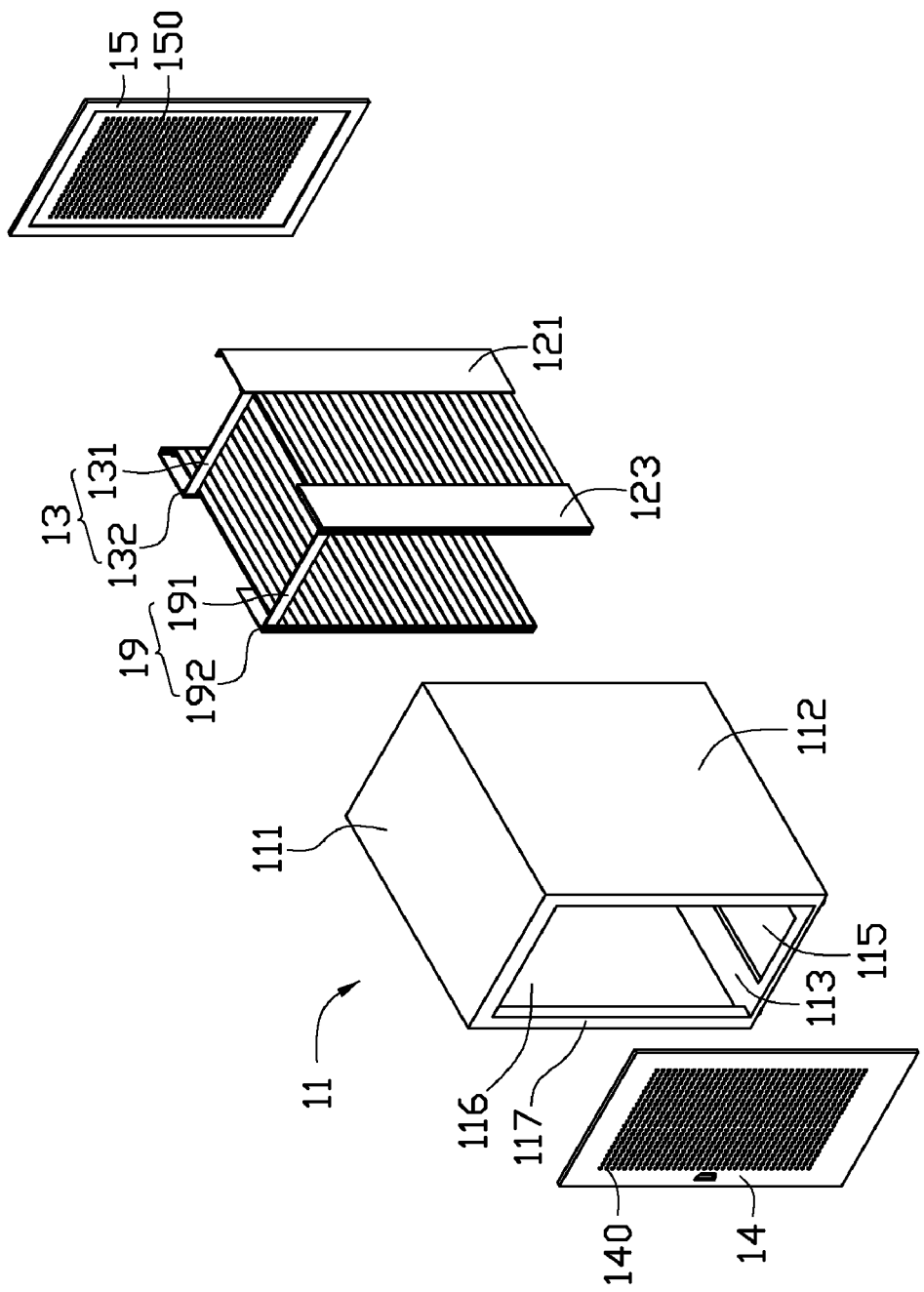
FIG. 5 is an exploded view of a server cabinet in accordance with a second embodiment of the present disclosure.

FIG. 5 shows a server cabinet in accordance with a second embodiment of the present disclosure. The difference between this server cabinet and the server cabinet illustrated in the first embodiment lies in the supporting frame 12. In this embodiment, the supporting frame 12 includes another air baffle plate 19 connected between the top ends of two vertical walls 123 which are located adjacent to the front ends of the left sidewall 117 and right sidewall 112, respectively.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. A server cabinet comprising:
  a rack defining an interior space configured for accommodating a plurality of servers therein, the rack comprising a top wall, an opposite bottom wall and two sidewalls respectively connected between left sides of the top and the bottom walls and right sides of the top and the bottom walls, the servers being arranged along a bottom-to-top direction, each of the servers being fixed between the two sidewalls, a space being defined between a topmost server and the top wall; and
  an air baffle plate positioned in the space for blocking an airflow on rear sides of the servers from flowing back to front sides of the servers via the space.

2. The server cabinet of claim 1, wherein the rack further comprises a front door connected between front sides of the top and the bottom walls and a rear plate connected between rear sides of the top and the bottom walls, each of the front door and the rear plate defining a plurality of air ventilation holes therein.

3. The server cabinet of claim 2, wherein a first room is defined between the front sides of the servers and the front door, a second room is defined between the rear sides of the servers and the rear plate, and the space is separated by the air baffle plate into two portions communicated with the first room and the second room respectively.

4. The server cabinet of claim 1, further comprising a supporting frame received in the rack, the supporting frame comprising two first vertical walls located adjacent to one of the sidewalls, two second vertical walls located adjacent to the other sidewall and a plurality of pairs of rails arranged along the bottom-to-top direction, each pair of rails being configured for supporting a server thereon.

5. The server cabinet of claim 4, wherein each pair of rails comprises a first rail connected between the first vertical walls and a second rail connected between the second vertical walls, the first rail and the second rail of each pair of rails being level with each other.

6. The server cabinet of claim 4, wherein the air baffle plate is above and perpendicular to a topmost pair of rails, the air baffle plate connected between a top end of one of the first vertical walls and a top end of one of the second vertical walls.

7. The server cabinet of claim 6, wherein the air baffle plate comprises an elongated main body and two fixing portions extending perpendicularly from two opposite ends of the main body, the air baffle plate connected to the supporting frame via the fixing portions fixedly attached to the top end of the one of the first vertical walls and the top end of the one of the second vertical walls.

8. The server cabinet of claim 6, further comprising another air baffle plate connected between a top end of the other first vertical wall and a top end of the other second vertical wall.

9. The server cabinet of claim 1, wherein the air baffle plate is extended between the two opposite sidewalls, top and bottom ends of the air baffle plate abutting against the top wall and the topmost server, respectively.

10. A server cabinet comprising:
a rack comprising a top wall, an opposite bottom wall and two sidewalls connected between two opposite sides of the top and the bottom walls, an interior space being defined among the top wall, the opposite bottom wall and the sidewalls configured for accommodating at least one server therein along a bottom-to-top direction; and
an air baffle plate extending downwardly from the top wall of the rack and abutting the two sidewalls, the air baffle plate being configured for abutting the at least one server and for keeping airflow flowing from one lateral side of the air baffle plate to an opposite lateral side of the air baffle plate along a space between the top wall and the at least one server after the at least one server is assembled into the rack.

11. The server cabinet of claim 10, wherein the rack further comprises a door and a plate respectively connected between another two opposite sides of the top and the bottom walls, each of the door and the plate defining a plurality of air ventilation holes therein.

12. The server cabinet of claim 11, wherein after the at least one server is assembled into the rack, a first room is defined between the at least one server and the door, a second room is defined between the at least one server and the plate, and the space is separated by the air baffle plate into two portions communicated with the first room and the second room respectively.

13. The server cabinet of claim 10, further comprising a supporting frame received in the rack, the supporting frame comprising two first vertical walls located adjacent to one of the sidewalls, two second vertical walls located adjacent to the other sidewall and a plurality of pairs of rails arranged along the bottom-to-top direction, each pair of rails comprising a first rail connected between the first vertical walls and a second rail connected between the second vertical walls, the first rail and the second rail of each pair of rails being at a same level and adapted for supporting one server of the at least one server thereon.

14. The server cabinet of claim 13, wherein the air baffle plate is perpendicular to the top wall, and is connected between a top end of one of the first vertical walls and a top end of one of the second vertical walls.

15. The server cabinet of claim 14, wherein the air baffle plate comprises an elongated main body, and two fixing portions extending perpendicularly from two opposite ends of the main body and fixedly connected to the top ends of the one of the first vertical walls and the one of the second vertical walls.

16. The server cabinet of claim 14, further comprising another air baffle plate connected between a top end of the other first vertical wall and a top end of the other second vertical wall.

* * * * *